(12) United States Patent
Patra

(10) Patent No.: US 8,724,080 B2
(45) Date of Patent: May 13, 2014

(54) OPTICAL RASTER ELEMENT, OPTICAL INTEGRATOR AND ILLUMINATION SYSTEM OF A MICROLITHOGRAPHIC PROJECTION EXPOSURE APPARATUS

(75) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 112 days.

(21) Appl. No.: 13/022,265

(22) Filed: Feb. 7, 2011

(65) Prior Publication Data

US 2011/0194090 A1 Aug. 11, 2011

Related U.S. Application Data

(60) Provisional application No. 61/302,599, filed on Feb. 9, 2010.

(30) Foreign Application Priority Data

Feb. 9, 2010 (EP) .................................... 10001311

(51) Int. Cl.
*G03B 27/42* (2006.01)
(52) U.S. Cl.
USPC .................. 355/53; 355/63; 355/67; 355/77; 355/55; 359/619; 359/620; 359/621; 359/622; 359/623; 359/624; 359/628
(58) Field of Classification Search
USPC ............ 355/53, 67, 55, 63, 77; 359/619–624, 359/628
See application file for complete search history.

(56) References Cited

U.S. PATENT DOCUMENTS

| 6,133,986 | A | 10/2000 | Johnson |
| 6,563,567 | B1 | 5/2003 | Komatsuda et al. |
| 7,061,582 | B2 | 6/2006 | Zinn et al. |

(Continued)

FOREIGN PATENT DOCUMENTS

| EP | 1 262 836 | 12/2002 |
| WO | WO 2005/026843 | 3/2005 |

(Continued)

OTHER PUBLICATIONS

European Search Report for corresponding EP Application No. 10 001 311.9, dated Aug. 2, 2010.

(Continued)

*Primary Examiner* — Steven H Whitesell Gordon
*Assistant Examiner* — Mesfin T Asfaw
(74) *Attorney, Agent, or Firm* — Fish & Richardson P.C.

(57) ABSTRACT

An optical raster element for an illumination system of a microlithographic projection exposure apparatus includes an array of refractive optical elements extending on a planar or curved surface. At least two of the optical elements are arranged side by side along a reference direction with a pitch of less than 2 mm. They have a height perpendicular to the surface of less than 50 μm and a surface profile along the reference direction which includes a central section, two transition sections adjacent the central section and two end sections adjacent the transition sections. The curvatures in the two transition sections are greater than the curvatures in the central section and the end sections. The optical raster element is intended for being used as a first channel plate in an optical integrator (honeycomb condenser) and can reduce the maximum light intensities occurring in or behind the second channel plate.

8 Claims, 9 Drawing Sheets

(56) References Cited

U.S. PATENT DOCUMENTS

| | | |
|---|---|---|
| 2003/0086524 A1 | 5/2003 | Schultz et al. |
| 2004/0036977 A1 | 2/2004 | Tanaka et al. |
| 2005/0018294 A1 | 1/2005 | Hauschild |
| 2005/0286123 A1* | 12/2005 | Abu-Ageel ............ 359/443 |
| 2006/0087634 A1 | 4/2006 | Brown et al. |
| 2007/0216887 A1 | 9/2007 | Singer et al. |
| 2007/0279535 A1 | 12/2007 | Fiolka |
| 2009/0021716 A1 | 1/2009 | Wangler et al. |
| 2009/0021839 A1 | 1/2009 | Wolf et al. |

FOREIGN PATENT DOCUMENTS

| | | |
|---|---|---|
| WO | WO 2005/078522 | 8/2005 |
| WO | WO 2007/093436 | 8/2007 |
| WO | WO 2009/080279 | 7/2009 |

OTHER PUBLICATIONS

"Curvature," http://en.wikipedia.org/wiki/Curvature, 1-10, bearing the date Oct. 31, 2012.

* cited by examiner

OPTICAL RASTER ELEMENT, OPTICAL INTEGRATOR AND ILLUMINATION SYSTEM OF A MICROLITHOGRAPHIC PROJECTION EXPOSURE APPARATUS

CROSS-REFERENCE TO RELATED APPLICATIONS

This application claims priority under 35 U.S.C. §119(e)(1) to U.S. Provisional Application No. 61/302,599, filed on Feb. 9, 2010. This application also benefit under 35 U.S.C. §119 to European Application No. 10 001 311.9, filed Feb. 9, 2010. The contents of both of these applications are hereby incorporated by reference in its entirety.

FIELD OF THE DISCLOSURE

The disclosure generally relates to an optical raster element, an optical integrator including an optical raster element, and an illumination system of a microlithographic projection exposure apparatus including a micromirror array.

DESCRIPTION OF RELATED ART

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) or extreme ultraviolet (EUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes an illumination system for illuminating the mask, a mask stage for aligning the mask, a projection objective and a wafer alignment stage for aligning the wafer coated with the photoresist. The illumination system illuminates a field on the mask that may have the shape of a rectangular or curved slit, for example.

Ideally, the illumination system illuminates each point of the illuminated field on the mask with projection light having a well defined intensity and angular distribution. The term angular distribution describes how the total light energy of a light bundle, which converges towards a particular point on the mask, is distributed among the various directions of the rays that constitute the light bundle.

The angular distribution of the projection light impinging on the mask is usually adapted to the kind of pattern to be projected onto the photoresist. For example, relatively large sized features may require a different angular distribution than small sized features. The most commonly used angular distributions of projection light are referred to as conventional, annular, dipole and quadrupole illumination settings. These terms refer to the intensity distribution in a system pupil surface of the illumination system. With an annular illumination setting, for example, only an annular region is illuminated in the system pupil surface. Thus there is only a small range of angles present in the angular distribution of the projection light, and thus all light rays impinge obliquely with similar angles onto the mask.

Modification of the angular distribution of the projection light in the mask plane so as to achieve the desired illumination setting can be achieved in a variety of ways. For achieving maximum flexibility in producing different angular distribution in the mask plane, it has been proposed to use mirror arrays that illuminate the pupil surface.

In EP 1 262 836 A1 the mirror array is realized as a microelectromechanical system (MEMS) including more than 1000 microscopic mirrors. Each of the mirrors can be tilted about two orthogonal tilt axes. Thus radiation incident on such a mirror device can be reflected into almost any desired direction of a hemisphere. A condenser lens arranged between the mirror array and the pupil surface translates the reflection angles produced by the mirrors into locations in the pupil surface. This known illumination system makes it possible to illuminate the pupil surface with a plurality of spots, wherein each spot is associated with one particular mirror and is freely movable across the pupil surface by tilting this mirror.

Similar illumination systems are known from US 2006/0087634 A1, U.S. Pat. No. 7,061,582 B2 and WO 2005/026843 A2.

Ideally each spot in the pupil surface has the same intensity. This may require that also the mirrors of the mirror array (or the microlenses of a preceding microlens array) are illuminated with equal intensities. However, the intensity of the light beams produced by light sources that are typically used in such illumination systems varies strongly over their cross section of the beam. Therefore some kind of light mixing element can be required between the light source and the mirror array.

WO 2009/080279 A1 discusses various devices that may be used as a light mixing element for this particular purpose. In one embodiment an optical integrator configured as a honeycomb condenser is used as light mixing element. The optical integrator includes two optical raster elements (often referred to as channel plates) that each includes an array of spherical microlenses. Additional devices, for example an oscillating mirror, are proposed that help to illuminate the microlenses of the first channel plate more homogenously. This reduces the time averaged light intensities that occur in these microlenses. Damages caused by too high light intensities in the channel plates are an issue because the high energy projection light has still a small cross section and a small divergence in this part of the illumination system. Particularly in or behind microlenses having a positive refractive power, the light energy is often concentrated within very small volumes. Optical materials within these volumes may then undergo, at least in the long term, material degradations that adversely affect the optical properties of the affected optical elements.

This issue becomes even more serious with the introduction of the next generation of projection light sources which will increase the light intensities by a factor of about 1.5. It has been found that for such high light intensities particularly the second optical raster element of the optical integrator is prone to be damaged by the projection light.

SUMMARY

Optical raster elements are disclosed that are suitable to be used as a first channel plate in an optical integrator, which is contained in an illumination system of a microlithographic projection exposure apparatus and mixes light to uniformly illuminate a mirror array or a microlens array preceding the mirror array. The optical raster element shall reduce the maximum light intensities that occur in the second channel plate and/or a subsequent optical element so that material degradations are prevented that would otherwise adversely affect the optical properties of the second channel plate and/or of an optical element arranged immediately behind the second channel plate.

In some embodiments, an optical raster element that includes an array of refractive optical elements extending on a planar or curved surface can be used. At least two of the optical elements are arranged side by side along a reference direction with a pitch of less than 2 mm. Furthermore, the at least two optical elements have a height perpendicular to the surface of less than 50 µm. The surface profile of the at least two optical elements along the reference direction includes a central section, two transition sections adjacent the central section and two end section adjacent the transition sections. The curvatures in the two transition sections are greater than the curvatures in the central section and the end sections.

It has been discovered that such an optical raster element, when used as a first channel plate in an optical integrator, significantly reduces the maximum light intensities occurring in or immediately behind the second channel plate. Even with the next generation of high output projection light sources, material degradations can then be prevented. Nevertheless the function of the first channel plate, namely to direct all incoming light on the associated microlens of the second channel plate, can be fully maintained. This reduction of the maximum light intensities cannot be explained merely on the basis of geometrical optics, but only by taking into account the wave properties of the projection light that become prominent under the conditions described above.

Simulations have shown that the maximum intensities may be reduced by a factor of as much as $\frac{2}{3}$, at least for projection light that has a small divergence. With increasing divergence the positive effect of such a surface profile on the maximum light intensities decreases.

Since the optical raster element is intended for being used as a first channel plate in an optical integrator in which the channel plates are spaced apart by quite a long distance, the height of the at least two optical elements is smaller than 50 µm, and preferably smaller than 25 µm and still more preferably smaller than 10 µm.

As a result of the very small height of the at least two optical elements, the flattened central sections cannot be manufactured by polishing circular arc profiles using a polishing cloth or magnetorheologic fluids. Such methods are described in WO 2007/093436 for flattening the vertex zones of microlenses on the second channel plate so as to achieve a concentration of light energy in the center of the mask plane. Instead, the optical elements of the optical raster element may be manufactured using, fly-cut (see US 2009/0021839 A) or grey-tone lithographic manufacturing techniques. Ion beam etching and molding may be applicable, too, at least under certain circumstances, for example when using fused silica as material.

If the curvatures in the central section and/or in the end sections are zero, the profile in these sections will be straight. If all curvatures are zero except in the transition sections, the profile approaches the shape of an isosceles trapezoid the greater the curvature of the transition sections becomes. With very large curvatures in the transition sections the surface profile will have at least substantially the shape of an isosceles trapezoid.

In some embodiments, the curvature in the central section is equal to or greater than the curvature in the end sections. It is noted that even if the height of the optical element was much higher, such a profile could not be manufactured from circular arc profiles by flattening the vertex zone.

In certain embodiments, the surface profile is subdivided into a plurality of Fresnel zone elements having a still smaller height.

In certain aspects, the invention features an optical integrator including the optical raster element as described above and a further optical raster element which is used as the second channel plate and which includes a further array of further refractive optical elements extending on a further planar or curved surface and which is, along a light propagation direction, arranged behind the optical raster element.

In certain aspects, the invention features an illumination system of a microlithographic projection exposure apparatus including, along a light propagation direction, an optical integrator as described above, a condensing optical system and an array of mirrors.

The condensing optical system establishes a Fourier relationship between a first surface, which may be adjacent the further array of refractive optical elements, and a second surface, for example an array of mirrors or an array of microlenses that illuminates the array of mirrors.

The illumination system may include, behind the array of mirrors, a further condensing optical system and a further optical integrator.

In certain aspects, the invention features a holographic diffractive optical element which is configured to produce the same far field intensity distribution as the above described optical raster element.

Such a holographic diffractive optical element may be used as a first channel plate in an optical integrator including an optical raster element which includes an array of refractive optical elements extending on a planar or curved surface and which is, along a light propagation direction, arranged behind the diffractive optical element and thus forms a second channel plate of the optical integrator.

BRIEF DESCRIPTION OF THE DRAWINGS

Various features and advantages may be more readily understood with reference to the following detailed description taken in conjunction with the accompanying drawing in which.

DETAILED DESCRIPTION

I

General Construction of Projection Exposure Apparatus

Figure 1:
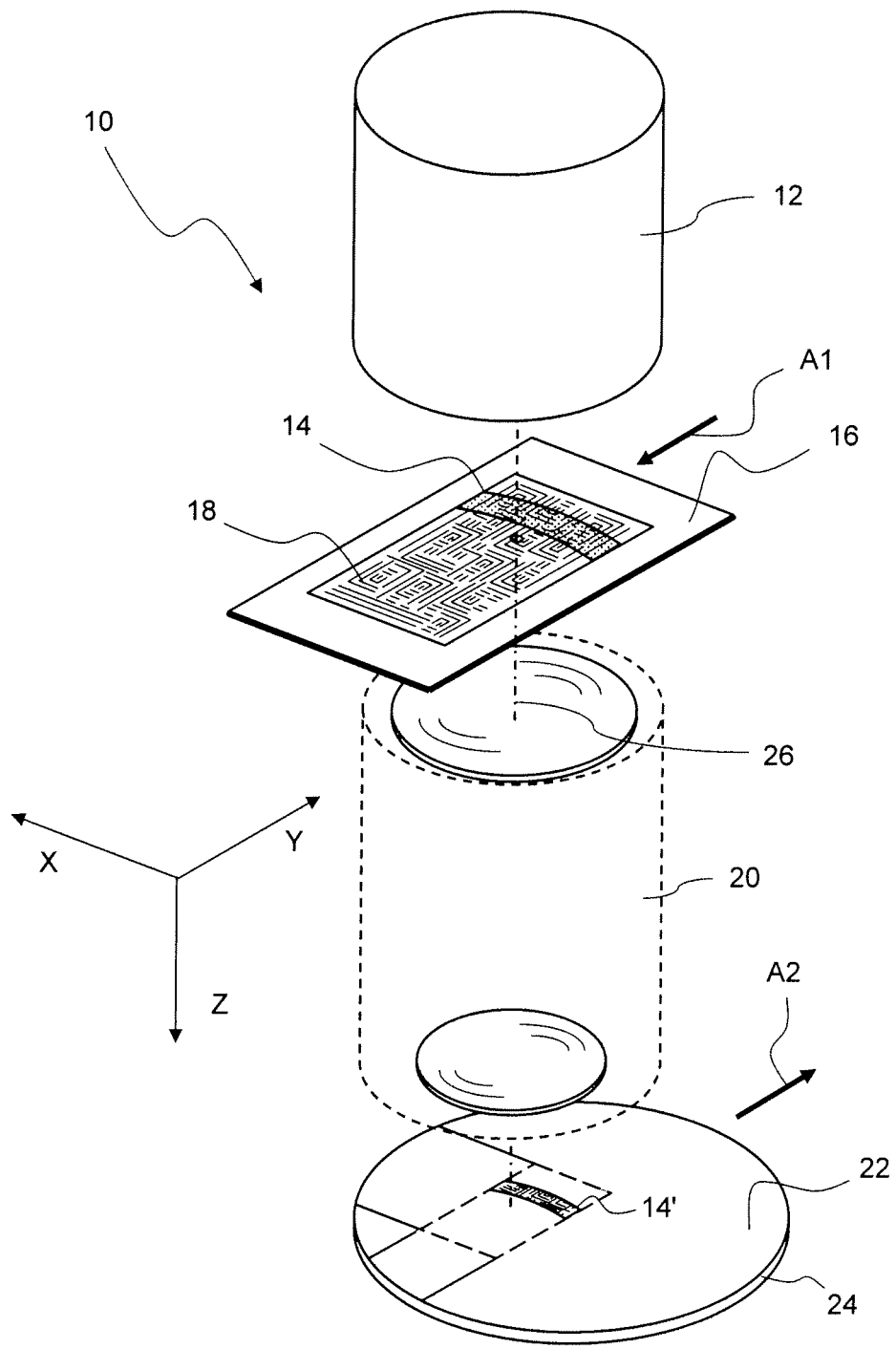
FIG. 1 is a perspective view of an embodiment of a projection exposure apparatus.

FIG. 1 is a perspective and simplified view of a projection exposure apparatus 10 including an illumination system 12 which produces a projection light beam. The projection light beam illuminates a field 14 on a mask 16 containing minute structures 18. In this embodiment the illuminated field 14 has the shape of a ring segment. However, other shapes of the illuminated field 14, for example rectangles, are contemplated as well.

A projection objective 20 images the structures 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned using a mask stage (not shown) in an object plane of the projection objective 20. Since the latter has a magnification β with |β|<1, a minified image 14' of the structures 18 within the illuminated field 14 is projected onto the light sensitive layer 22.

During the projection the mask 16 and the substrate 24 move along a scan direction which coincides with the Y direction indicated in FIG. 1. The illuminated field 14 then scans over the mask 16 so that structured areas larger than the illuminated field 14 can be continuously projected. Such a type of projection exposure apparatus is often referred to as "step-and-scan tool" or simply a "scanner". The ratio between the velocities of the substrate 24 and the mask 16 is equal to the magnification β of the projection objective 20. If the projection objective 20 inverts the image (β<0), the mask 16 and the substrate 24 move in opposite directions, as this is indicated in FIG. 1 by arrows A1 and A2. However, the present invention may also be used in stepper tools in which the mask 16 and the substrate 24 do not move during projection of the mask.

II

General Construction of Illumination System

Figure 2:
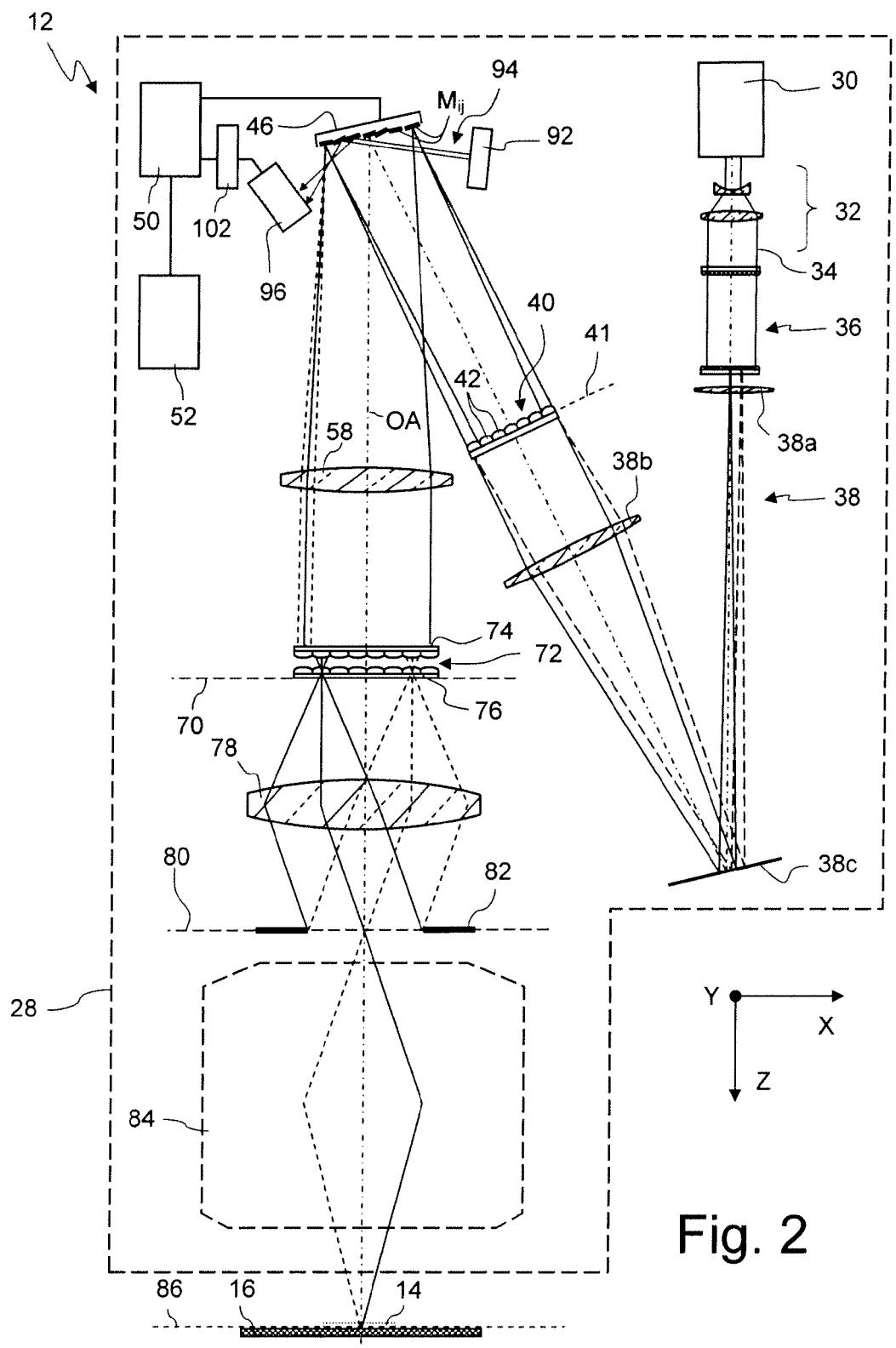
FIG. 2 is a meridional section through an illumination system which is part of the apparatus shown in FIG. 1.

FIG. 2 is a meridional section through the illumination system 12 shown in FIG. 1. For the sake of clarity, the illustration of FIG. 2 is considerably simplified and not to scale. This particularly implies that different optical units are represented by one or very few optical elements only. In reality, these units may include significantly more lenses and other optical elements.

The illumination system 12 includes a housing 28 and a light source that is, in the embodiment shown, realized as an excimer laser 30. The excimer laser 30 emits projection light that has a wavelength of about 193 nm. Other types of light sources and other wavelengths, for example 248 nm or 157 nm, are also contemplated.

In the embodiment shown, the projection light emitted by the excimer laser 30 enters a beam expansion unit 32 in which the light beam is expanded without altering the geometrical optical flux. The beam expansion unit 32 may include several lenses as shown in FIG. 2, or may be realized as a mirror arrangement, for example. The projection light emerges from the beam expansion unit 32 as a beam 34 having a small divergence. The term divergence here denotes the maximum angle that light rays form with respect to a reference direction, for example a surface normal associated with an optical element or, as in the present context, the optical axis OA of the illumination system. The intensity of the beam 34 is not uniform across its cross section, but varies significantly.

The beam 34 impinges on a first optical integrator 36 that produces a plurality of secondary light sources. The first optical integrator 36 consists of two optical raster elements each including at least one microlens array. The divergence of the beam 34 is thereby increased by a small amount, typically by a few millirad at most. The first optical integrator 36 will be described in more detail further below in section III.

The beam 34 emerging from the first optical integrator 36 enters a first condenser 38 which includes in this embodiment a plurality of optical elements from which only two lenses 38a, 38b and a planar folding mirror 38c are shown in FIG. 2. The first condenser 38 establishes a Fourier relationship between a plane in the vicinity of the first optical integrator 36 and a plane 41 in which an array 40 of microlenses 42 is arranged. Thus each secondary light source produced by the first optical integrator 36 illuminates the complete array 40 of microlenses 42, but from different directions, as it is indicated in FIG. 2 for two light bundles represented by solid and dashed lines. In this way the plane 41, in which the array 40 of microlenses 42 is arranged, is uniformly illuminated by the beam 34.

Since the divergence of the beam 34 shall only be slightly increased by the first optical integrator 36, the focal length of the first condenser 38 has to be quite long. For that reason one or more folding mirrors 38c may be provided that assist in keeping the overall dimensions of the illumination system 12 small.

This part of the illumination system 12 may include further optical components, for example devices that help to reduce the spatial coherence. Reference is made to WO 2009/080279 in which various configurations of this part of the illumination system 12 are described in more detail.

A mirror array 46 is arranged in or in close vicinity to a back focal plane of the microlenses 42. The mirror array 46 includes a plurality of small individual mirrors $M_{ij}$ that can be tilted, independently from each other, by two tilt axes that are preferably aligned perpendicularly to each other. The total number of mirrors $M_{ij}$ may exceed 100 or even several 1000. In this embodiment the number of mirrors $M_{ij}$ is equal to the number of microlenses 42 of the microlens array 40 that are uniformly illuminated by the secondary light sources produced by the first optical integrator 34. Thus each microlens 40 directs a converging light beam of equal intensity and small divergence on a mirror $M_{ij}$ of the mirror array 46 that is associated with the respective microlens 40.

The tilting movements of the individual mirrors $M_{ij}$ are controlled by a mirror control unit 50 which is connected to an overall system control 52 of the illumination system 12. Actuators that are used to set the desired tilt angles of the mirrors $M_{ij}$ receive control signals from the mirror control unit 50 such that each individual mirror $M_{ij}$ is capable of reflecting an impinging light ray by a reflection angle that is variable in response to the control signal. In the embodiment shown there is a continuous range of tilt angles at which the individual mirrors $M_{ij}$ can be arranged. In other embodiments, the actuators are configured such that only a limited number of discrete tilt angles can be set.

Figure 3:
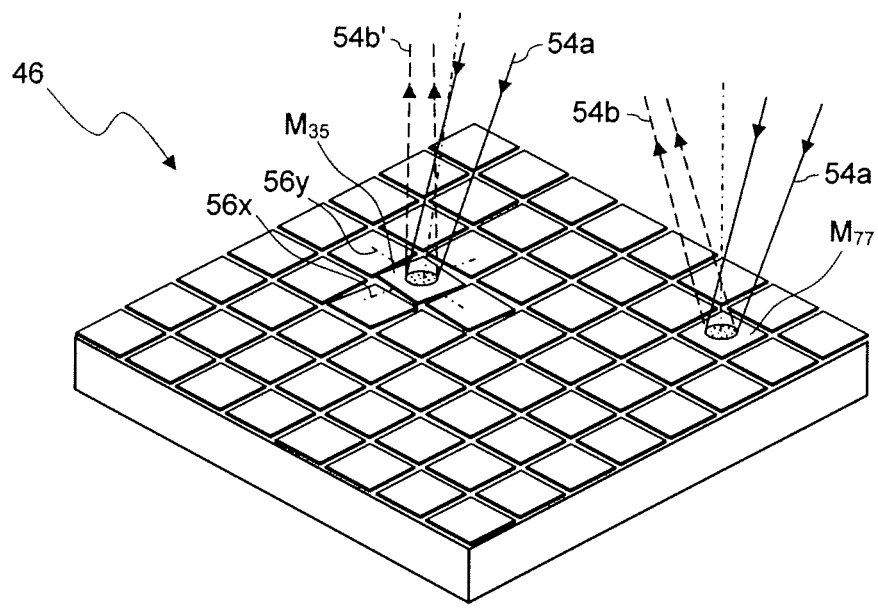
FIG. 3 is a perspective view on a mirror array contained in the illumination system shown in FIG. 2.

FIG. 3 is a perspective view of the mirror array 46 including, for the sake of simplicity, only 8·8=64 mirrors $M_{ij}$. Light beams 54a impinging on the mirror array 46 are reflected to different directions depending on the tilt angles of the mirrors $M_{ij}$. In this schematic representation it is assumed that a particular mirror $M_{35}$ is tilted about two tilt axes 56x, 56y relative to another mirror $M_{77}$ so that the light beams 54b, 54b' are reflected by the mirrors $M_{35}$ and $M_{77}$ into different directions.

Referring again to FIG. 2, the light beams reflected from the mirror $M_{ij}$ impinge on a second condenser 58 which ensures that the slightly diverging light beams impinge, now as at least substantially parallel light beams, on a second optical integrator 72 which also produces a plurality of secondary light sources. The second optical integrator 72 again increases the divergence, but now, at least along the X direction which is perpendicular to the scan direction Y, by a much larger amount.

In this embodiment also the second optical integrator 72 includes two optical raster elements 74, 76 which are realized as fly's eye lenses. Each optical raster element 74, 76 includes two orthogonal arrays of parallel cylindrical microlenses. Other configurations of the second optical integrator are envisaged as well, for example integrators including an array of microlenses that have rotationally symmetrical surfaces, but rectangular boundaries. Reference is made to WO 2005/078522 A, US 2004/0036977 A1 and US 2005/0018294 A1 that describe optical integrators that are suitable for being used as second optical integrator 72.

Reference numeral 70 denotes a system pupil surface of the illumination system 12 that substantially defines the angular distribution of the light impinging on the mask 14. The system pupil surface 70 is usually plane or slightly curved and is arranged in or in immediate vicinity to the second optical integrator 72. The angular light distribution in the system pupil surface 70 directly translates into an intensity distribution in a subsequent field plane, and therefore the second optical integrator 72 substantially determines the basic geometry of the illuminated field 14 on the mask 16. Since the second optical integrator 72 increases the divergence considerably more in the X direction than in the scan direction Y, the illuminated field 14 has larger dimensions along the X direction than along the scan direction Y.

The projection light emerging from the secondary light sources produced by the second optical integrator 72 enters a third condenser 78 that is represented in FIG. 2 by a single lens only for the sake of simplicity. The second condenser 78 ensures a Fourier relationship between the system pupil surface 70 and a subsequent intermediate field plane 80 in which a field stop 82 is arranged. By superimposing the light bundles, which are produced by the secondary light sources, in the intermediate field plane 80 with the help of the second condenser 78, a very uniform illumination of the intermediate field plane 80 is achieved. The field stop 82 may include a plurality of movable blades and ensures (to the extent desired) sharp edges of the illuminated field 14 on the mask 16.

A field stop objective 84 provides optical conjugation between the intermediate field plane 80 and the mask plane 86 in which the mask 16 is arranged. The field stop 82 is thus sharply imaged by the field stop objective 84 onto the mask 16.

III

First Optical Integrator

Figure 4:
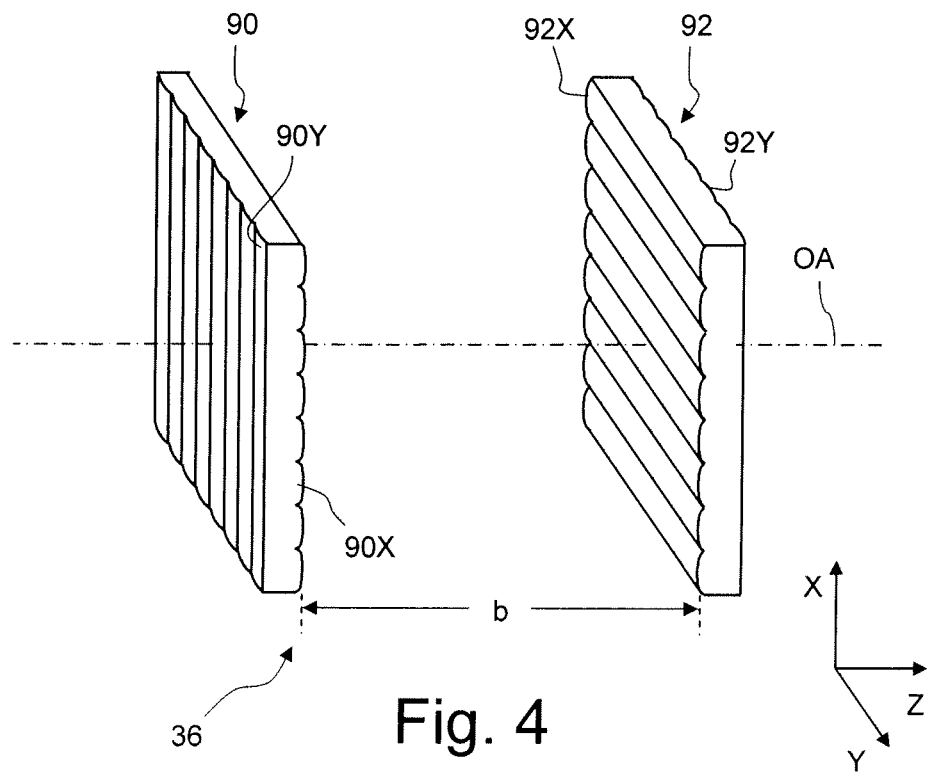
FIG. 4 is a perspective view of a first optical integrator contained in the illumination system shown in FIG. 2.

FIG. 4 is a schematic perspective view of the first optical integrator 36. The first optical integrator 36 of this embodiment includes a first optical raster element 90 and a second optical raster element 92 that are spaced apart along the optical axis OA by a distance b. One surface of the first optical raster element 90 is formed by a first array of cylindrical microlenses 90Y having parallel longitudinal axes that are aligned along an X direction.

In this context the term "microlens" or "lens" refers to an optical element that has a curved surface profile. The term "cylindrical" means that the microlens has a straight or curved longitudinal axis along which the surface profile is constant. The term "surface profile" relates to the shape of the surface in a cross section perpendicular to the longitudinal axis of a cylindrical microlens or, in the case of a rotationally symmetrical microlens, in a cross section containing the axis of rotational symmetry. The surface profile mainly determines the optical properties of the microlens. For example, if a cylindrical microlens has curved surface profile which is circular, it has the effect of a spherical lens in a XZ plane. If the curved surface profile is not circular, the cylindrical microlens has the effect of an aspherical lens in this plane.

The opposite surface of the first optical raster element 90 is formed by an array of cylindrical microlenses 90X that have parallel longitudinal axes aligned along a Y direction which is perpendicular to the X direction. Since the longitudinal axes are either parallel to the X or to the Y direction, the microlenses 90Y have a refractive power only along the Y direction, and the microlenses 90X have a refractive power only along the X direction.

The second optical raster element 92 has a similar configuration, but is mounted, in this embodiment, after rotation by 180° around the X or Y axis.

Each microlens 90X, 90Y, 92X, 92Y is geometrically defined by its longitudinal axis, its width and the curved surface profile. Usually there are no gaps between adjacent microlenses. Then the width of the microlenses 90X, 90Y, 92X, 92Y is equal to the pitch of the respective array. Generally the pitches of the microlens arrays should be smaller than 5 mm or better smaller than 2 mm. In the embodiment shown the pitches are in a range between several micrometers up to several hundred micrometers, for example 1000 μm. Usually it is preferred to have pitches that are greater, for example by a factor 50 or 100, than the wavelength of the light which propagates through the first optical integrator 36.

The microlenses 92X, 92Y on the second optical raster element each have circular arc profile in this embodiment. Since the optical integrator should not increase the divergence of the beam 34 too much, the curvature of the surface profiles of the microlenses 92X, 92Y should be small. For example, the radius of curvature may be as large as 300 mm. The distance b between the first and the second optical raster elements 90, 92 is approximately equal to the focal length of the microlenses 92X so that the microlenses 90X on the first optical raster element 90 are arranged in a front focal plane of the microlenses 92X. Similarly, the microlenses 90Y on the first optical raster element 90 are arranged in a front focal plane of the microlenses 92Y on the second optical raster element 92. This establishes an optical relationship between microlenses on the first and second optical raster element 90, 92 so that pairs of microlenses 90Y and 92Y having a refractive power along the Y direction are associated with each other, and also pairs of microlenses 90X, 92X having a refractive power along the X direction are associated with each other.

Figure 5:
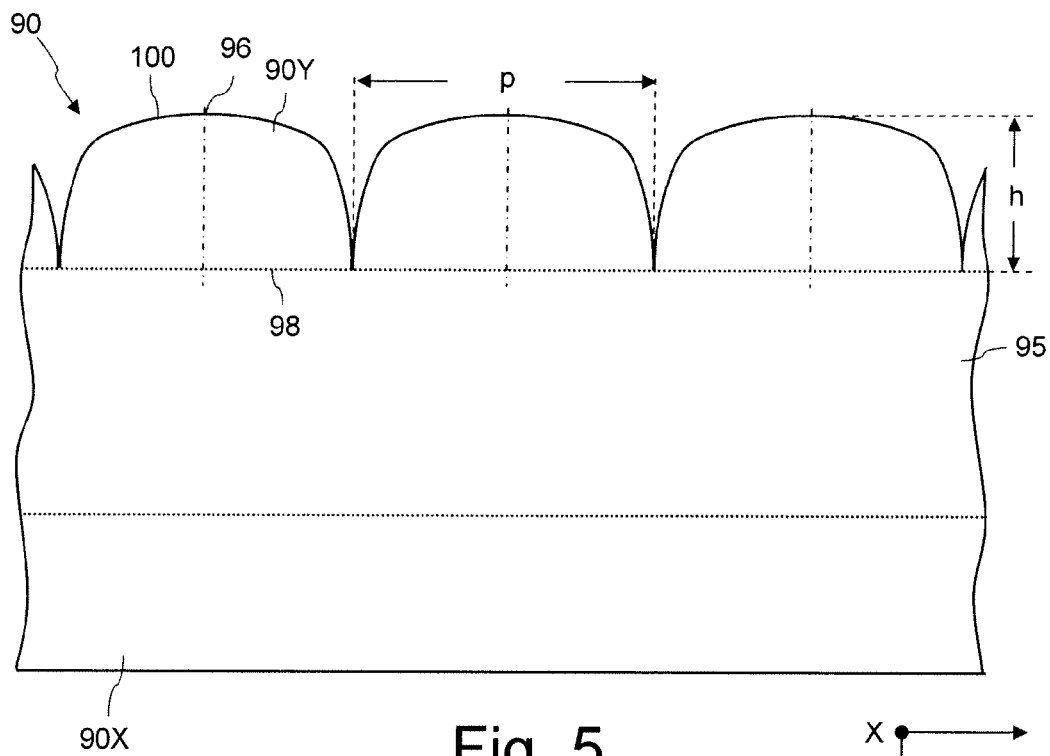
FIG. 5 is a partial cross section through a first integrator member of the first optical integrator shown in FIG. 4.

The microlenses 90X, 90Y on the first optical raster element 90 do not have a circular surface profile, as will be explained in the following in more detail with reference to FIGS. 5 and 6:

FIG. 5 is a partial cross section through the first optical raster element 90 in an XY plane. The first optical raster element 90 includes a substrate 95 having opposite sides on which the microlenses 90X, 90Y are formed. Each microlens 90Y, 90X has a height h which is measured between its vertex line 96 and an (imaginary) base surface 98 which may be considered as a ground surface on which the curved first and second microlenses 90Y, 90X are applied on. Since the microlenses will usually be formed by removing material (e.g. by etching) and not by adding material, the height h equals the maximum removal depth. The base surface 98 may be defined as the surface in which the borderlines between adjacent microlenses 90X, 90Y are arranged.

In this embodiment the microlenses 90X, 90Y have a very similar (or even the same) surface profile 100 which is mirror symmetrical with respect to a symmetry plane which extends through the vertex line 96 of each microlens 90X, 90Y.

Figure 6:
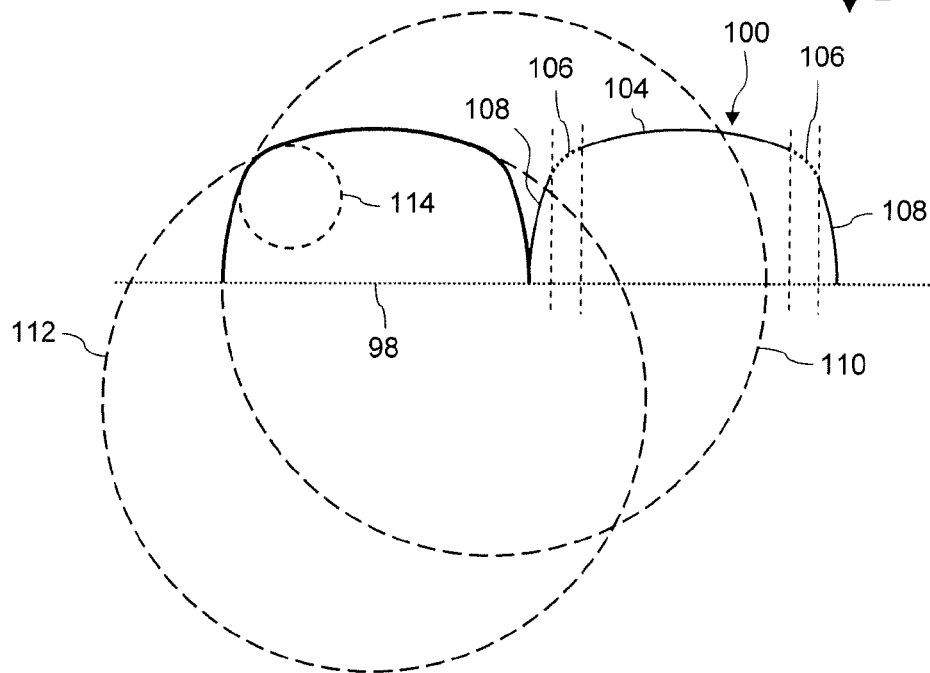
FIG. 6 shows a surface profile of two adjacent microlenses of the first integrator member shown in FIG. 5.

FIG. 6 shows the surface profiles 100 of two adjacent microlenses 90Y. As it is indicated for the right surface profile 100 with vertical dashed lines 102, each surface profile includes a central section 104, two transition sections 106 adjacent to the central section 104, and two end sections 108 adjacent to the transition sections 106. For the sake of clarity the transition sections 106 are drawn as dotted lines for the surface profile 100 on the right hand side.

As becomes clear from the identical surface profile 100 shown on the left hand side, the curvatures of the two transition sections 106 are greater than the curvatures in the central section 104 and the curvatures in the end sections 108. The curvature c of a curved line at a point $P_0$ is usually defined by the radius R with R=1/c for a circle that has the same tangent line at the point $P_0$ as the curved line itself. In the embodiment shown in FIGS. 5 and 6 the central section 104 and the end sections 108 are circular arc profiles, as it is indicated by dashed lines 110 and 112, respectively. Furthermore, the radii of these circles 110, 112 are equal so that the curvatures of the central section 104 and the end sections 108 are equal, too. Also the profile of the transition sections 106 are circular arc profiles, but the radius of the circle 114 defining this circular arc profile is significantly smaller than the radius of the circles 110, 112 defining the profiles of the central section 104 and the end sections 108.

It should be noted that the surface profiles 100 shown in FIGS. 5 and 6 are not to scale for the sake of clarity. For example, assuming a radius of curvature of the central section 104 of 100 mm and a pitch p=2 mm, the height h of the first and second microlenses 90Y, X will be about 5 µm. In other words, the surfaces of the microlenses 90X, 90Y are so flat that the differences in the curvatures could not be perceived any more.

Figure 7:
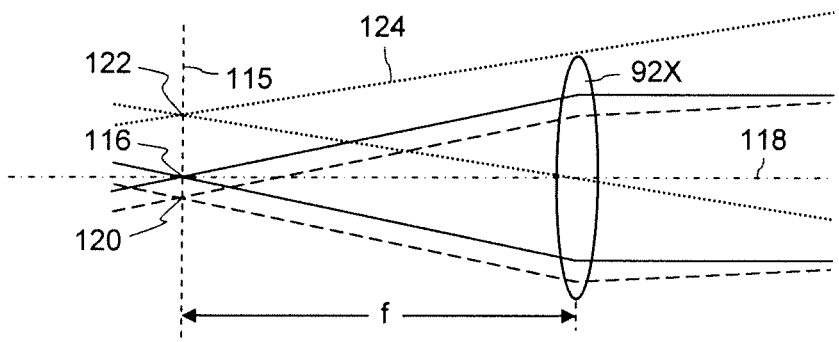
FIG. 7 is a meridional section through a microlens of a second integrator member of an optical integrator.
Figure 8:
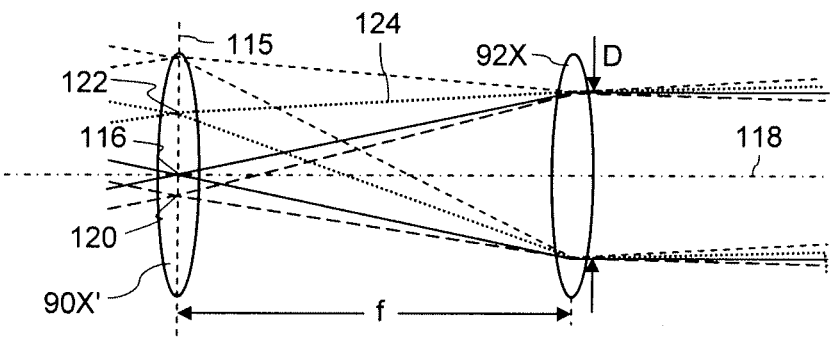
FIG. 8 is a meridional section similar to FIG. 7, but with an additional spherical microlens of a first integrator member.

The function of the optical integrator 36 will now be described with reference to FIGS. 7 to 9:

FIG. 7 shows one of the microlenses 92X of the second optical raster element 92 in a meridional section. The microlens 92X has a front focal plane 115 at a distance which equals the focal length f of the microlens 92X. If a divergent light bundle emerges from a point 116 which is situated in the front focal plane 115 and on the optical axis 118 of the microlens 92X, the light bundle will leave the microlens 92X as collimated bundle which is parallel to the optical axis 118, as it is indicated in FIG. 7 with solid lines.

Similarly, if a divergent light bundle emerges from a paraxial point 120 in the front focal plane 115 and passes through the microlens 92X, it will leave the latter again as collimated bundle (see dashed lines), but now forming an angle with the optical axis 118. This angle increases with increasing distance of the point 120 from the optical axis 118.

Each collimated light bundle uniformly illuminates in the far field a certain area. The uniformity is further improved by superimposing the collimated light bundles that originally emerged from the points 116, 120 in the front focal plane 115. A condenser arranged behind the microlenses 92X may be used to support this superposition and to reduce the distance between the microlenses 92X and the area where the best possible superimposition of the light bundle occurs.

However, if the distance between the paraxial point 120 and the optical axis 118 is increased further, there will be eventually a distance for which the rays of the light bundle will no longer be able to impinge on the microlens 92X. This is indicated in FIG. 7 for a marginal ray 124 represented by a dotted line. This marginal ray 124 may impinge on an adjacent microlens 92X, but will then not leave this adjacent microlens 92X parallel to those rays that have propagated through the microlens 92X shown in FIG. 7. Marginal rays 124 that impinge on adjacent microlenses therefore disturb the uniformity of the illumination in the far field.

For that reason conventional optical integrators usually include an additional first optical raster element with spherical microlenses 90X'. Each microlens 90X' is arranged in or in close vicinity to the front focal plane 114 of the associated microlens 92X of the second optical raster element, as it is shown in FIG. 8. The spherical microlenses 90X' have the same focal length as the associated microlens 92X. Thus all light rays impinging on a microlens 90X' under the same angle, i.e. parallel to each other, meet at a single point on or within the associated microlens 92X of the second optical raster element. The marginal ray 124 emerging from the off-axis point 122 is now refracted to such an extent that it is able to impinge on the microlens 92X and to contribute to the uniform illumination in the far field.

The two lenses 90X', 92X arranged on a common optical axis 118 are usually referred to as a "channel" of the optical integrator. This channel has the property that all light impinging on its front facet (i.e. the front surface of the microlens 90X') emerges from the associated microlens 92X, but usually with a different divergence which is determined by the (equal) focal lengths f of the microlenses 90X', 92X. Furthermore, small gaps remain between the light bundles emerging from adjacent microlenses 92X so that an observer who looks along an optical axis 118 on the rear surface of the microlenses 92X would see, for each channel, a small circular bright spot having a diameter D. These bright spots are often referred to as "secondary light sources" because they have similar emission characteristics (i.e. dependence of radiant emittance on emission angle) as many real light sources.

If the divergence of the incoming light decreases, also the diameter D of the secondary light sources decreases, and consequently the light intensity in the bright spots forming the secondary light sources increases. However, if the intensity of the projection light within the microlenses 92X increases above a certain threshold value, undesired material degradations will occur in the long term that impair the optical properties of the microlenses 92X in a manner that cannot be tolerated. Particularly for long focal lengths f also an optical element behind the microlenses 92X may suffer from very high light intensities in a similar manner.

Figure 9:
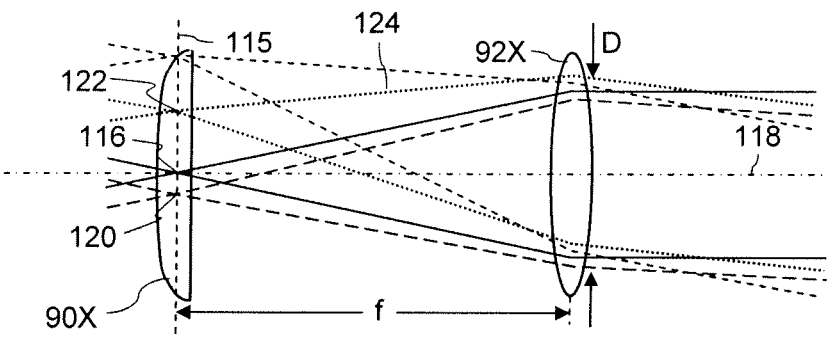
FIG. 9 is a meridional section similar to FIG. 8, but with an additional aspherical microlens of the first integrator.

FIG. 9 shows a single channel of the optical integrator 36 in accordance with the present invention. In contrast to the solution shown in FIG. 8 in which the second microlenses 90X' have at least one circular arc surface profile, the microlenses 90X of the first optical raster element 90 have the surface profile 100 including the three sections that have been explained above with reference to FIGS. 5 and 6. As a result of this specific surface profile 100, parallel light rays impinging on a microlens 90X are not focused at a single point in or on the microlens 92X of the second optical raster element 92, but are spread apart substantially in directions perpendicular to the optical axis 118, as can be seen in FIG. 9. Therefore also the diameter D of the secondary light source associated with this particular channel is enlarged, and consequently the risk of material degradations caused by high light intensities is reduced. However, it is to be noted that this effect is achieved without compromising the desired effect of producing collimated light bundles that superimpose in the far field.

The reduction of light intensities in the microlens 92X is illustrated in FIG. 9 solely on the basis of geometrical optics. However, it has to be appreciated that the intensities that will occur in reality have to be computed on the basis of simulations which take into account the wave character of the light impinging on the optical integrator 36. The results of such simulations will be explained further below with reference to FIGS. 14 and 15.

It turns out that also the intensities occurring in an optical element behind the second optical raster element 92 are considerably reduced if the microlenses 90X on the first optical raster element 90 have a surface profile 100 with five sections having alternating curvatures. This reduction is due to a better utilization of wave optical effects.

According to the invention the curvatures in the two transition sections 106 are greater than the curvatures in the central section 104 and the end sections 108 of the surface profile 100. However, not all surface profiles fulfilling this condition are able to direct all impinging light on the associated microlens 92X of the second integrator member 92. To achieve this, the surface profile function p(x) describing the surface profile 100 has to fulfill the following condition:

$$\Delta - (p+2x)/2 \le (n-1) \cdot p'(x) \le (p-2x)/2a - \Delta$$

In this equation Δ denotes the divergence of the light, p is the pitch, n the refractive index of the microlens 90X, b the distance between the first and second integrator members 90, 92, and p'(x) the first derivative of the surface profile function p(x).

In the foregoing the function of the new surface profile 100 has been explained above only with reference to the microlenses 90X and 92X. As a matter of course, the same considerations apply correspondingly to the other pair of associated microlenses 90Y, 92Y that have a refractive power only along the Y direction.

IV

Alternative Embodiments

Figure 10:
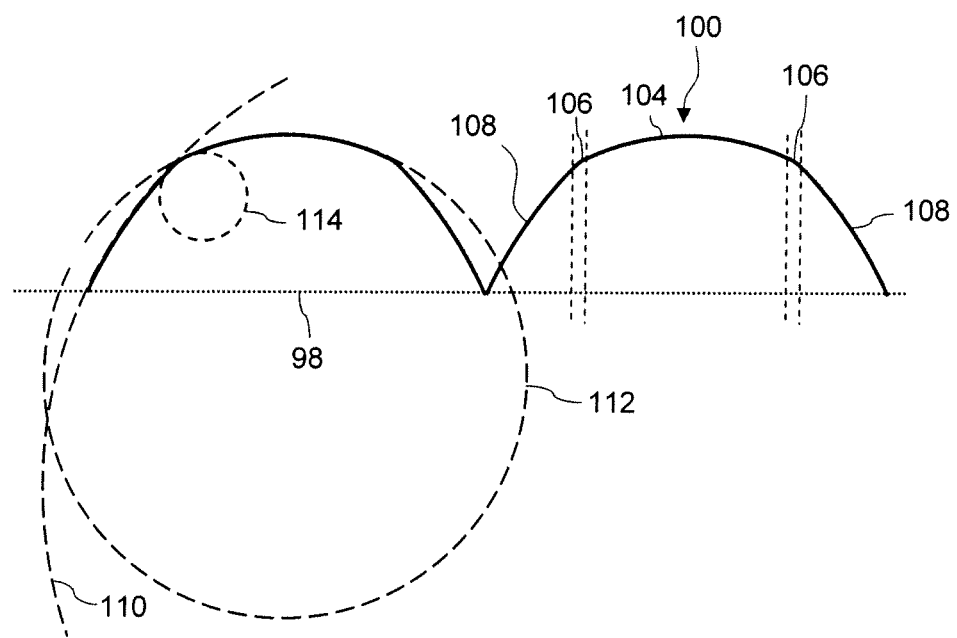
FIG. 10 shows a surface profile of two adjacent microlenses according to embodiments in which the end sections have a smaller curvature than the central section.

In the embodiment described above it has been assumed that the curvatures of the central section 104 and the end sections 108 are all equal so that the circles 110, 112 have the same radii. However, a similar reduction of intensity maxima may be obtained if these curvatures are different, as it is shown in FIG. 10. Here the radius of curvature of the central section 104 (see circle 112) is smaller than the radius of curvature of the end sections 108 (see circle 110).

Figure 11:
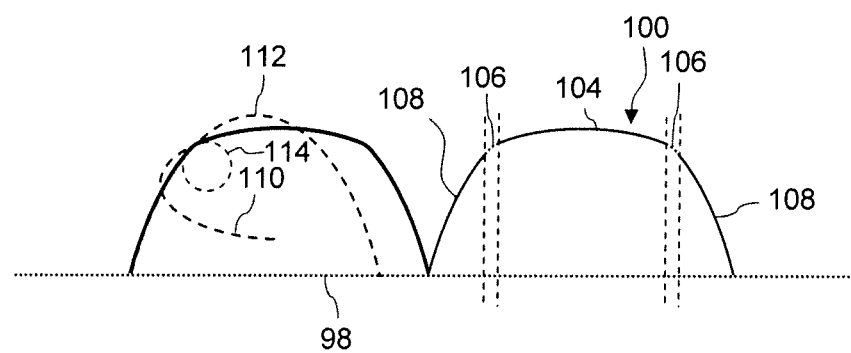
FIG. 11 shows a surface profile of two adjacent microlenses according to embodiments in which the end sections and the central section are parabolic.

Furthermore, it is not necessary that the curvature within each of the sections 104, 106, 108 is constant. FIG. 11 shows an embodiment in which the central section 104 and the end sections 108 are formed by parabolic curves that are connected by circular curves forming the transition sections 106.

Figure 12:
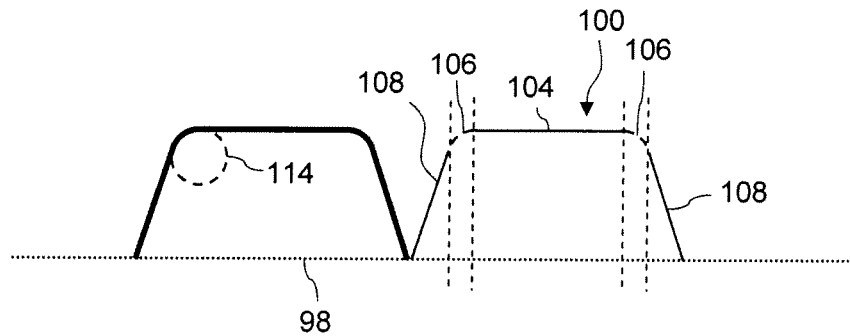
FIG. 12 shows a surface profile of two adjacent microlenses according to embodiments in which the end sections and the central section are straight.

It is also possible to increase the curvatures of the central section 104 and the end sections 108 to zero, which means that the associated radii of curvature are infinite. Then the surface profile 100 in these sections is straight, as it is shown in FIG. 12. Only the two transition sections 106 are formed by (circular) curves.

Figure 13:
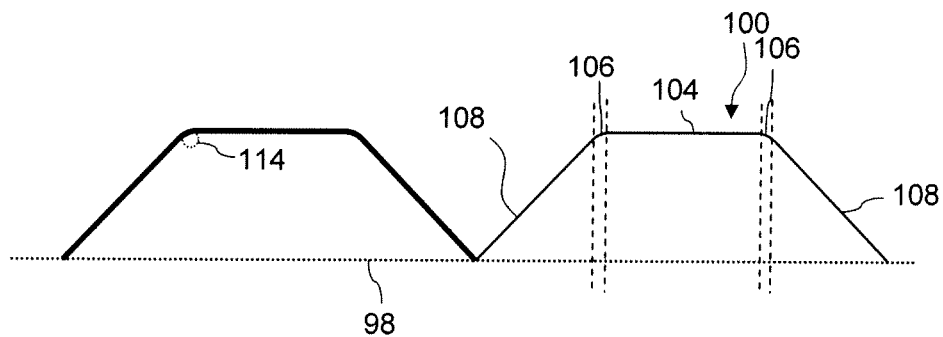
FIG. 13 shows a surface profile of two adjacent microlenses similar to FIG. 12, but with more strongly curved transition sections.

If the radius of curvature of the transition sections 106 decreases, the surface profile 100 will resemble more and more the shape of an isosceles trapezoid, as it is shown in FIG. 13. If the radius of curvature in the transition section 106 approaches zero, a geometrical isosceles trapezoid is obtained so that the microlenses 90X, 90Y transform into prisms.

Figures 14, 15:
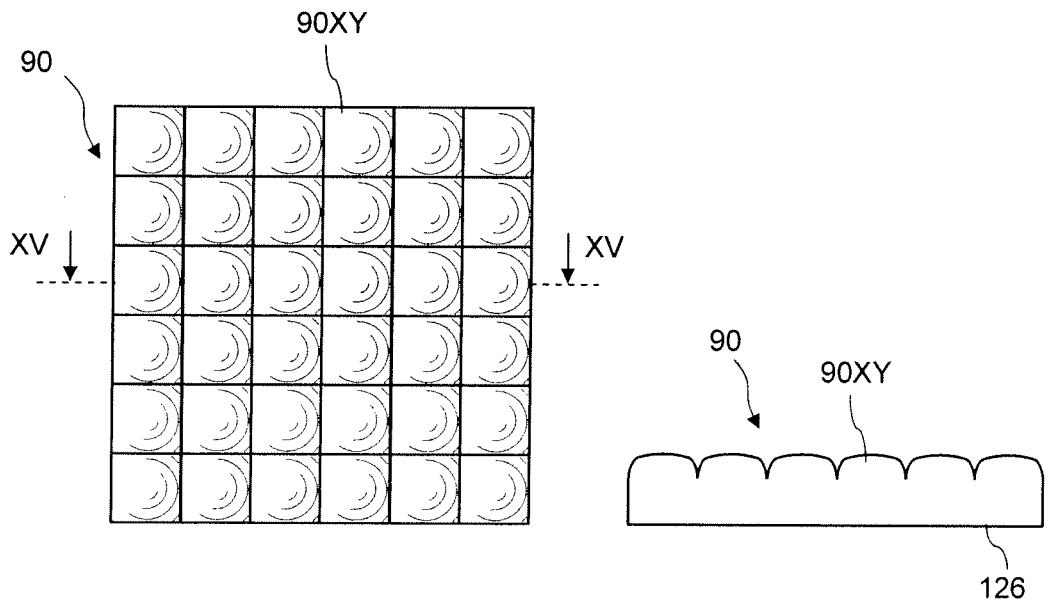
FIG. 14 is a top view on a first integrator member including an array of rotationally symmetrical microlenses.
FIG. 15 is a cross section along line XV-XV through the first integrator member shown in FIG. 14.

In the foregoing it has been assumed that the optical raster elements 90, 92 include two arrays of cylindrical lenses 90X, 90Y and 92X, 92Y, respectively. As a matter of course, these arrays may be replaced by arrays of microlenses having a rotationally symmetrical surface. FIG. 14 is a simplified top view on a first optical raster element 90 including 66 microlenses 90XY with rotationally symmetrical surfaces. Each microlens 90XY may be considered as being produced from a rotationally symmetrical lens having a circular circumference which has been subjected to a cutting step so that a square circumference is achieved. Such a configuration is often referred to as honeycomb condenser in a stricter sense.

FIG. 15 is a cross section along line XV-XV through the first optical raster element 90 shown in FIG. 14. Since the microlenses 90XY have refractive power both along the X and Y directions, only one side of the substrate 95 supports microlenses 90XY, whereas the opposite side 126 does not support any optical elements and is preferably planar.

Figure 16:
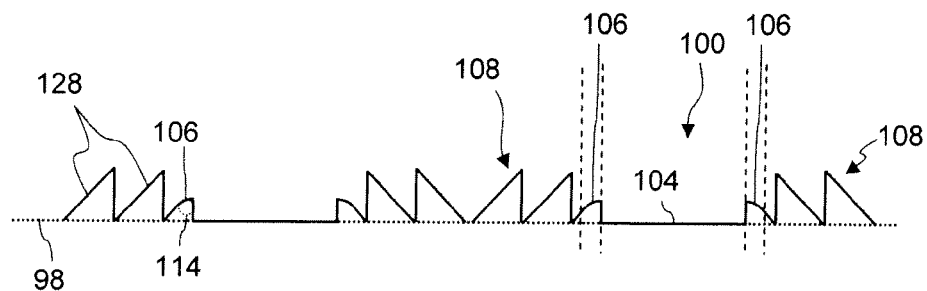
FIG. 16 shows a surface profile similar to FIG. 14, but divided into a plurality of Fresnel zone elements.

It is also possible to subdivide the microlenses 90X, 90Y on the first optical raster element 90 into a plurality of Fresnel zone elements 128, as it is schematically illustrated in FIG. 16. The optically effective portions of the Fresnel zone elements 128, i.e. the portions that do not extend perpendicular to the base surface 98, add to a profile 100 which has the same sections as it has been explained above with reference to FIG. 13.

Figure 17:
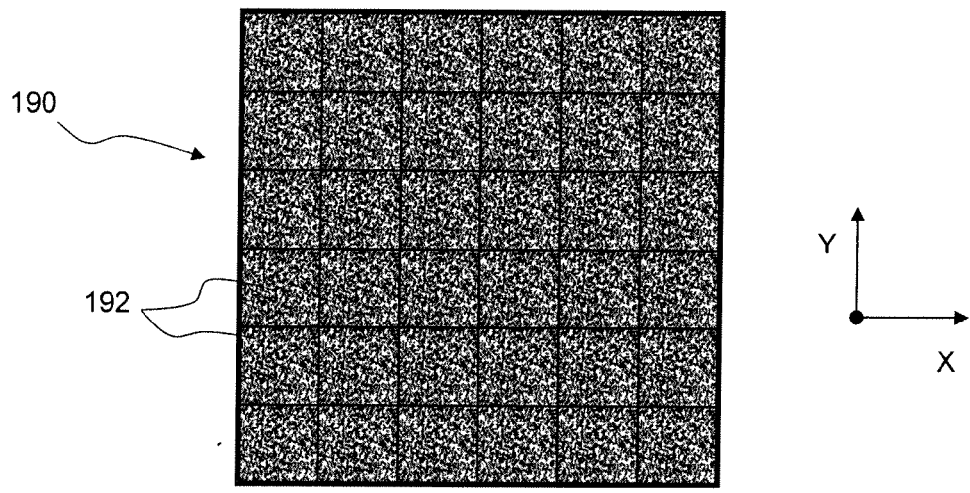
FIG. 17 is a top view on a first integrator member including a plurality of holographic diffractive optical elements.

FIG. 17 is a top view on a first optical raster element in which the microlens arrays are replaced by an array of holographic diffractive optical elements 192 (also referred to as computer generated holograms, CGH). Each diffractive optical element 192 includes minute diffractive structures that have been computationally designed such that the diffractive optical element 192 has the same effect as one of the microlenses 90XY shown in FIGS. 14 and 15. As a matter of course, the diffractive optical elements 192 may also be designed such that they have the same effect as one of the cylindrical microlenses 90X, 90Y shown in FIGS. 4 to 13. In this case two arrays of diffractive optical elements 192 may be applied on opposite surfaces on a substrate of the first optical raster element 90.

Figure 18:
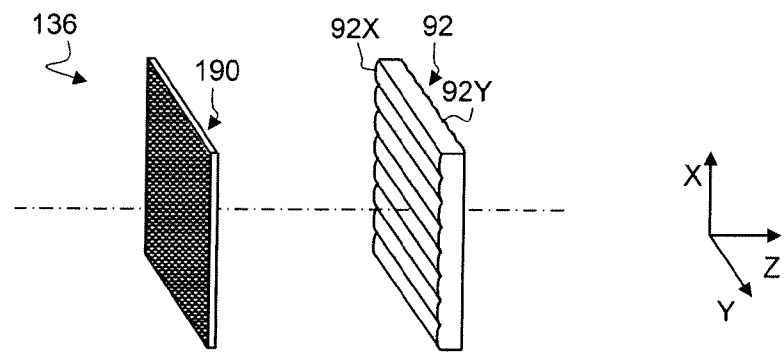
FIG. 18 is a perspective view of a first optical integrator containing the first integrator member shown in FIG. 17.

FIG. 18 is a perspective view on an optical integrator 136 that consists of the first optical raster element 190 shown in FIG. 17 and a conventional second optical raster element 92 including two orthogonal arrays of microlenses 92X, 92Y as shown in FIG. 4.

V

Simulation Results

Figures 19, 20:
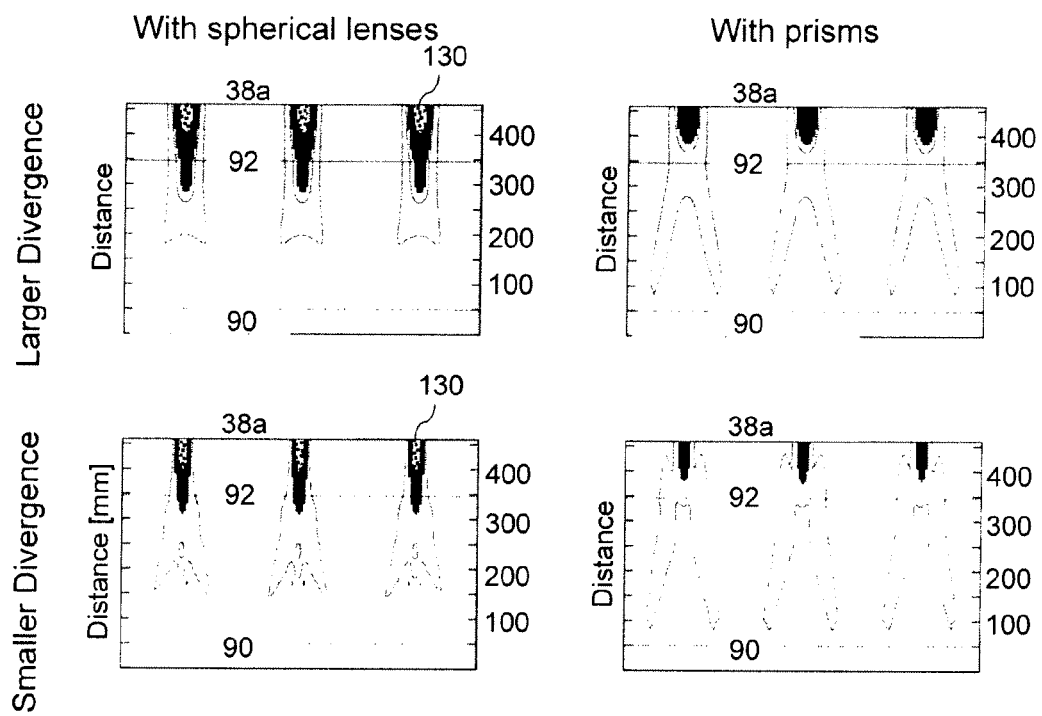
FIG. 19 shows two graphs illustrating the intensities occurring in the second integrator member when using conventional surface profiles.
FIG. 20 shows two graphs illustrating the intensities occurring in the second integrator member when using surface profiles according to the disclosure.

FIGS. 19 and 20 show the result of simulations in which the intensities occurring in the first optical integrator 36 and the first lens 38a of the first condenser 38 are computed on the basis of optical wave analysis algorithms. It is again noted that the benefits achieved by the present invention can only be explained by wave optical analysis, and any application of geometrical optics alone would lead to wrong conclusions.

The abscissa in each graph corresponds to an X or Y direction along which a plurality of microlenses 90X are arranged side by side. The ordinate indicates the Z coordinate, with the origin being at some distance in front of the first optical integrator 36. The Z coordinates of the first optical raster element 90 and the second optical raster element 92 are indicated with horizontal lines. The uppermost horizontal line indicates the Z position of the first following lens 38a.

Thin lines within the graphs indicate locations where equal intensities occur. Black areas indicate positions where the intensities are very high, but are still tolerable also in the long term. Dotted areas 130 denote regions where the intensities cannot be tolerated at least in the long term.

The two graphs in FIG. 19 show, for a comparison, the intensities that are obtained in an optical integrator in which the first optical raster element 90 has microlenses with a circular arc profile ("spherical lenses"). The two graphs shown in FIG. 19 differ from one another by the divergence that has been assumed when performing the simulation. For the upper of the two graphs a greater divergence has been assumed than for the lower of the two graphs.

As can be seen in the upper graph of FIG. 19, the intensities in the second optical raster element 92 are high, but still tolerable. However, in the first following lens 38a of the first condenser 38 there are areas 130 in which the intensities cannot be tolerated in the long term. A similar result is obtained if a smaller divergence of the impinging light is assumed (lower graph of FIG. 19). In this case the areas 130 where the intensities are intolerable are smaller, but are still present.

FIG. 20 shows similar graphs for the first optical integrator 36 in which the second microlenses 90X of the first optical raster element 90 have a surface profile 100 which at least substantially has the shape of an isosceles trapezoid as it is shown in FIG. 13. It can be seen that the black areas indicating very high intensities are much smaller and have moved outside the second optical raster element 92 completely. The highest intensities still occur at the first following lens 38a, however, there are no areas 130 in which the intensities cannot be tolerated in the long term.

The above description of embodiments has been given by way of example. Other embodiments are in the following claims.

What is claimed is:

1. An optical raster element, comprising:
an array of refractive optical elements extending on a planar or curved surface, wherein at least two of the optical elements
a) are arranged side by side along a reference direction with a pitch of less than 2 MM,
b) have a height perpendicular to the surface of less than 50 µm, and
c) have a surface profile along the reference direction which comprises
i) a central section,
ii) two transition sections adjacent the central section, and
iii) two end sections adjacent the transition sections,
wherein:
the curvatures in the two transition sections are greater than the curvatures in the central section and the end sections,
the entire surface profile defines an optically refractive surface, and
the optical raster element is for an illumination system of a microlithographic projection exposure apparatus.

2. The optical raster element of claim 1, wherein the curvatures in the central section and/or in the end sections are zero.

3. The optical raster element of claim 2, wherein the surface profile has at least substantially the shape of an isosceles trapezoid.

4. The optical raster element of claim 1, wherein the curvature in the central section is equal to or greater than the curvature in the end sections.

5. The optical raster element of claim 1, wherein the surface profile is subdivided into a plurality of Fresnel zones.

6. An optical integrator, comprising the optical raster element of claim 1 and a further optical raster element, which
a) comprises a further array of further refractive optical elements extending on a further planar or curved surface and which
b) is, along a light propagation direction, arranged behind the optical raster element.

7. An illumination system of a microlithographic projection exposure apparatus, comprising, along a light propagation direction,
a) the optical integrator of claim 6,
b) a condensing optical system, and
c) an array of mirrors.

8. The illumination system of claim 7, further comprising, behind the array of mirrors, a further condensing optical system and a further optical integrator.

* * * * *